(12) United States Patent
Raguin

(10) Patent No.: US 6,620,576 B2
(45) Date of Patent: Sep. 16, 2003

(54) METHODS OF MAKING STRUCTURES FROM PHOTOSENSITIVE COATINGS HAVING PROFILE HEIGHTS EXCEEDING FIFTEEN MICRONS

(75) Inventor: Daniel H. Raguin, Spencerport, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/119,139

(22) Filed: Apr. 10, 2002

(65) Prior Publication Data

US 2002/0182547 A1 Dec. 5, 2002

Related U.S. Application Data

(63) Continuation of application No. 09/094,340, filed on Jun. 9, 1998, now Pat. No. 6,410,213.

(51) Int. Cl.[7] .............................. G03F 7/38; B05D 3/02
(52) U.S. Cl. ....................... 430/321; 430/322; 430/330; 430/935; 430/945; 427/240; 427/372.2
(58) Field of Search ................................. 430/321, 322, 430/330, 935, 945; 427/240, 372.2

(56) References Cited

U.S. PATENT DOCUMENTS 5,248,576 A * 9/1993 Yokoyama et al. ............ 430/7
5,344,748 A * 9/1994 Feely .......................... 430/330
5,571,560 A * 11/1996 Lin ............................. 427/240
5,989,632 A * 11/1999 Sanada et al. ............... 427/240
5,998,096 A * 12/1999 Umemoto et al. ......... 430/281.1

* cited by examiner

Primary Examiner—S. Rosasco
Assistant Examiner—Nicole Barreca
(74) Attorney, Agent, or Firm—Nixon Peabody

(57) ABSTRACT

A method for fabricating a structure on a substrate with a low contrast photoresist having a height greater than 15 microns is provided. A uniformly thick film of photoresist is achieved on a substrate by spinning the substrate at two different speeds, then at least partially, but not fully drying the layer of photoresist at ambient temperature. The layer of photoresist is then dried and hardened by applying heat to the bottom surface of the substrate via a hot plate. The substrate is maintained level at all times during the spinning and drying steps in order to prevent wedging of the photoresist which remains in a plastic state until fully hardened by the hot plate. A surface relief pattern is then created in the photoresist via a scanning beam of electromagnetic radiation, which is preferably a laser beam. The resulting exposed surface relief patterns are then developed to produce the desired structure, which has a height of 15 microns or greater.

21 Claims, 21 Drawing Sheets

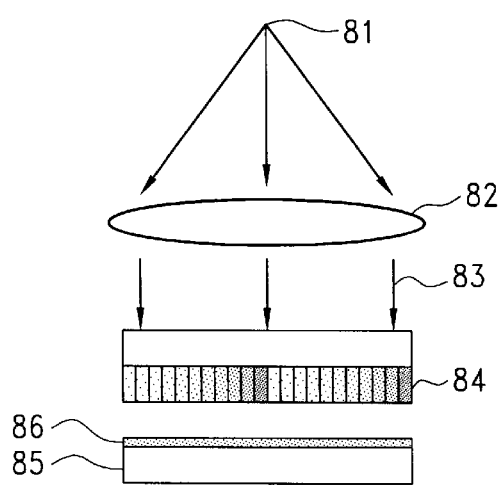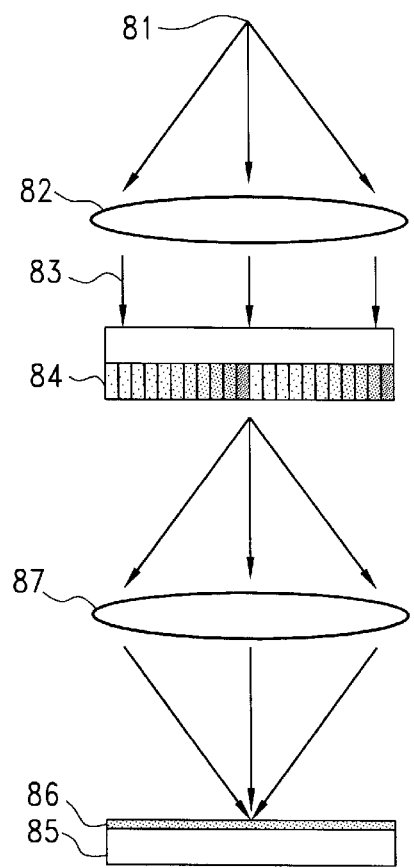
FIG.8(a)
FIG.8(b)

FIG.10(a)
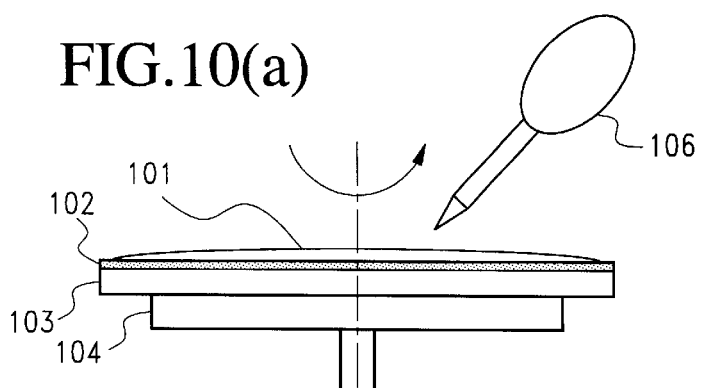
FIG.10(b)
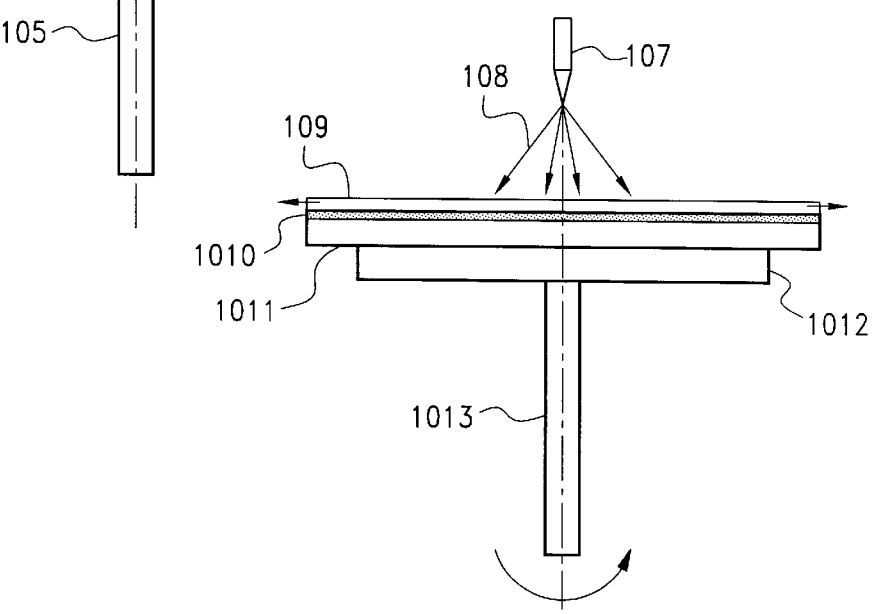
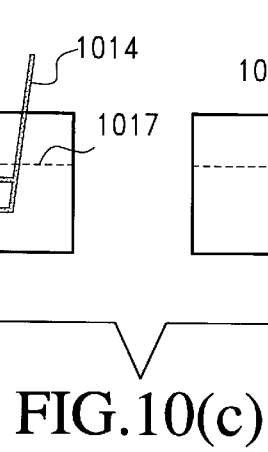
FIG.10(c)

METHODS OF MAKING STRUCTURES FROM PHOTOSENSITIVE COATINGS HAVING PROFILE HEIGHTS EXCEEDING FIFTEEN MICRONS

This is a continuation of U.S. Ser. No. 09/094,340 filed Jun. 9, 1998, now U.S. Pat. No. 6,410,213 and is related to the invention described in U.S. patent application Ser. No. 09/055,653 filed Apr. 6, 1998 now abandoned.

FIELD OF THE INVENTION

This invention generally concerns methods for producing structures over 15 microns in height from photosensitive coatings with an arbitrary surface-relief profile by scanning a pattern on the coating and then developing it. The resulting structure may, for example, be micro-optical elements such as lenses and gratings, or alignment and registration marks such as cross hairs.

BACKGROUND OF THE INVENTION

Previous methods of fabrication of elements using exposures of photoresist either concentrated upon fabricating binary (two-level) structures, such as in the case of micro electromechanical systems (MEMS), or exposed photoresist to a varying dosage of exposure radiation using thin photoresist. Photoresist has been exposed to create continuous-relief photoresist profiles of optical devices (e.g., microlenses, diffractive phase plates, and diffraction gratings). Exposure methods have included laser pattern generation, grayscale mask exposures, and holography.

The present invention overcomes the limitations of such prior processes in affording arbitrary microstructure profiles, especially with heights (sag in the case of lenses) exceeding 15 $\mu$m.

Laser pattern generators (LPGs) have been proposed to expose photoresist in a point-by-point fashion with variable exposure doses. Likewise, the use of grayscale mask lithography has been proposed to provide continuous-relief profiles in photoresist.

The present invention improves upon prior LPG methods even for the fabrication of diffractive elements by creating photoresist layers with uniform thicknesses over 15 $\mu$m, and then patterning the photoresist layer with blazed multilevel or continuous profiles at depths exceeding 15 $\mu$m. Prior to the present invention, no one had fabricated continuous-relief microlenses using a variable exposure dosage that resulted in microstructures with surface sags exceeding 15 $\mu$m.

SUMMARY OF THE INVENTION

The invention is a method of fabricating a structure on a substrate using a photosensitive material in liquid form which hardens by drying. The method comprises the steps of creating a uniform layer of the photosensitive material on the substrate having a height greater than 15 microns by spinning the substrate, at least partially but not fully drying the layer by allowing it to set at ambient temperature, and then fully drying and hardening the layer by applying heat to the bottom surface of the substrate. A surface relief pattern is then produced on the hardened layer of material with a scanning beam of varying dosage of electromagnetic radiation, and the exposed portions of the layer are developed in order to produce the structure.

In the preferred method of the invention, the photosensitive material capable of being processed with low contrast such as S1075 photoresist sold by Shipley Company, LLC located in Marlborough, Mass. The substrate is spun at a sufficiently low speed to produce a layer of photoresist having a thickness greater than 15 microns. In order to achieve a more uniform thickness, the spin-coating step of the method is preferably performed initially at a lower speed (for example, 200 rpms for 30 seconds) in order to spread the photoresist uniformly on the substrate, and then at a faster speed (i.e., 500 rpms for 3 minutes) to achieve the desired final thickness of the film.

After the spinning step, the photoresist-coated substrate is allowed to dry or set at ambient temperature for preferably 30 minutes in order to reduce stresses in the thick, viscous photoresist film, and to achieve a greater uniformity of thickness. The heating step is preferably performed by a hot plate with a ramping feature so that the photoresist is slowly ramped up to a soft baking temperature, thereby reducing the chance of solvent bubbles forming in the photoresist. In the preferred method, the hot plate is ramped up to a final temperature of 90° C., and the film-covered substrate is then baked for 10 minutes in order to completely harden the photoresist.

At all times during the spinning, air drying, and bake-drying steps, the coated substrate is maintained at a level orientation so that the photoresist layer (which is still in a plastic state) does not develop any wedging due to gravity-induced flow. The method of the invention is fully capable of creating photoresist film thicknesses of 50 microns or greater that are extremely uniform, thereby overcoming a major obstacle in the prior art to the creation of small structures in photoresist having heights greater than 15 microns. The use of a low contrast photoresist to form the thick photoresist layer allows patterns of arbitrary profile to be scanned into the layer and developed into the desired structures.

BRIEF DESCRIPTION OF THE DRAWINGS

The foregoing and other objects, features, and advantages of the invention will become more readily apparent by reference to the following detailed description when considered with the accompanying drawings, wherein:

FIG. 1A illustrating a fiber-to-fiber coupler, while FIG. 1B illustrates a micro-optical system for collimating and circularizing a beam from a semiconductor diode laser.

FIGS. 3A, 3B, and 3C are schematic diagrams of the steps involved in fabricating a microstructure using the inventive process hereof, both in photoresist and in masters to make microlenses in mass production, (FIG. 3A), while FIGS. 3B and 3C illustrate the steps which are used in high volume production.

FIGS. 8A and 8B are schematic diagrams which depict a mask aligner and a projection exposure system in FIGS. 8A and 8B, respectively. These systems can be used for the exposure of a photosensitive material to a variable dosage of electromagnetic radiation across the substrate.

FIGS. 10A–10C illustrate several steps for developing a photosensitive material that include puddle, spray, and dipping, which steps may be used alternatively in accordance with the invention.

DETAILED DESCRIPTION OF THE INVENTION

Figure 1A:
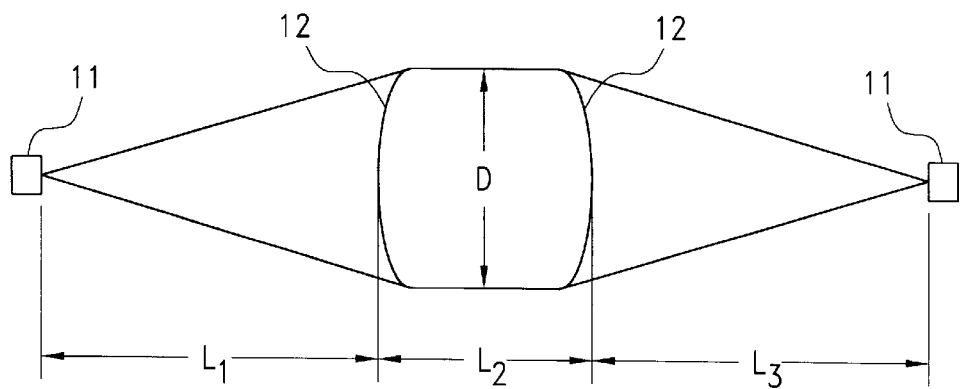
FIGS. 1A–1B are schematic diagrams of a system for optical data storage and optical telecommunications.
Figure 1B:
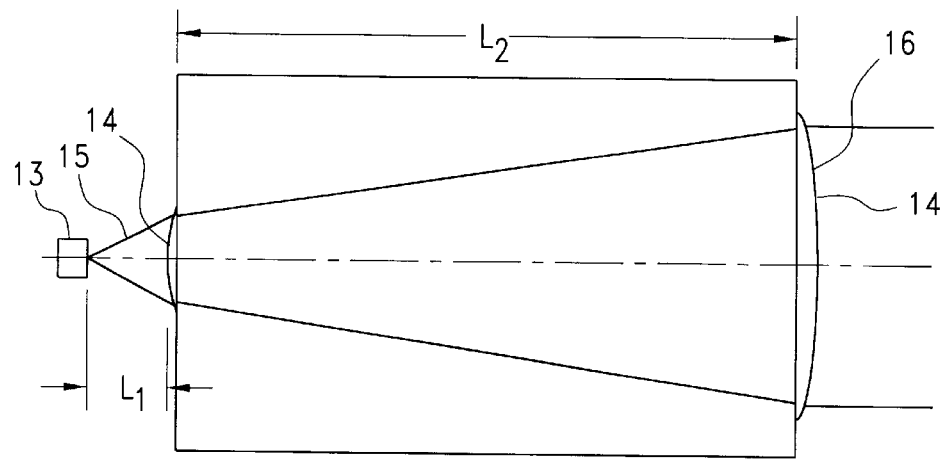

FIG. 1 illustrates some of the profiles needed by the telecommunications industry. FIG. 1A shows an optical design for a fiber-to-fiber coupler, and FIG. 1B shows a micro-optical element for collimating and circulating a semiconductor laser diode. In FIG. 1A, the two fibers 11 are assumed to be identical, both having NA=0.25. The collimating and focusing microlenses 12 are identical and are rotationally symmetric aspheric surfaces. For a diameter D of 140 $\mu$m, the surface sag of the microlenses is 20 $\mu$m. The separation distances $L_1$, $L_2$, and $L_3$ are 250 $\mu$m, 100 $\mu$m, and 250 $\mu$m, respectively. Such a design can achieve greater than 95% coupling efficiency. In FIG. 1B, the semiconductor laser 13 emits an astigmatic beam 15 that has a full width at $1/e^2$ of 8° and 21°. The astigmatism between the fast and slow axis is 4 $\mu$m. Using the invention described by this patent, one can fabricate a two-element system, wherein each element is a toroidal surface. The first microlens 14 has a clear aperture of 120 $\mu$m and a maximum sag of 16 $\mu$m. The second microlens 16 has a clear aperture of 600 $\mu$m and a sag of 35 $\mu$m. The dimensions $L_1$ and $L_2$ for FIG. 1B correspond to 130 $\mu$m and 4 mm, respectively. Note that since one can fabricate anamorphic microlenses of sags greater than 15 $\mu$m using this invention, one can produce a design illustrated schematically in FIG. 1B and achieve looser alignment tolerances than current commercially available micro-optical elements. For example, circularizers sold by Blue Sky Research, Santa Cruz, Calif., have only ±0.5 $\mu$m lateral tolerance in the fast axis of the laser, versus ±3 $\mu$m of the present design.

Figure 2A:
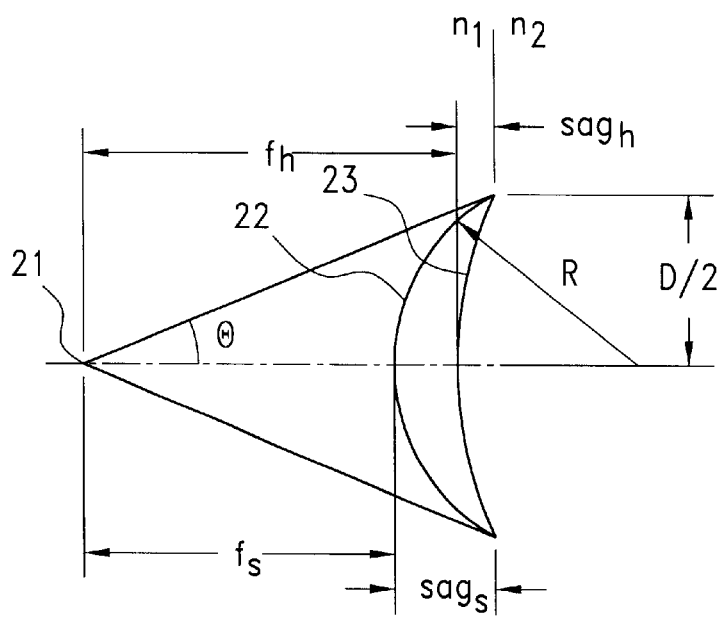
FIG. 2A is a schematic diagram illustrating a geometry of microlenses with spherical and hyperbolic surface-relief profiles.

FIG. 2 illustrates the geometry of microlenses with spherical and hyperbolic surface-relief profiles and illustrates the surface sags required for specific NAs and diameters. Illustrated in FIG. 2A is a schematic of how a point source 21 can be collimated by a microlens with a spherical 22 or a hyperbolic 23 relief profile. The sag of the spherical microlens is given by $$sag_s = R - \sqrt{R^2 - (D/2)^2},$$

Where D is the diameter of the microlens and R is the radius of curvature of the spherical surface and is related to the front focal length according to $$R = f_s(n_2 - n_1),$$

where n1 and n2 are the indices of refraction of the incident and transmitted media, respectively. For the hyperbolic surface, the surface sag is given by $$sag_h = \frac{f_h n_1}{(n_2 + n_1)}\left[\sqrt{1 + \frac{D^2}{4f_h^2}\frac{n_2 - n_1}{n_2 + n_1}} - 1\right],$$

where $f_h$ is front focal length of the hyperbolic microlens. Note that for a given NA defined by $n_1 \sin\theta$, the sag of the hyperbola will be less than that of the spherical lens. The hyperbolic surface is advantageous since it is the optimal refractive surface for collimating (or focusing) a point source when $n_2 > n_1$.

Figure 2B:
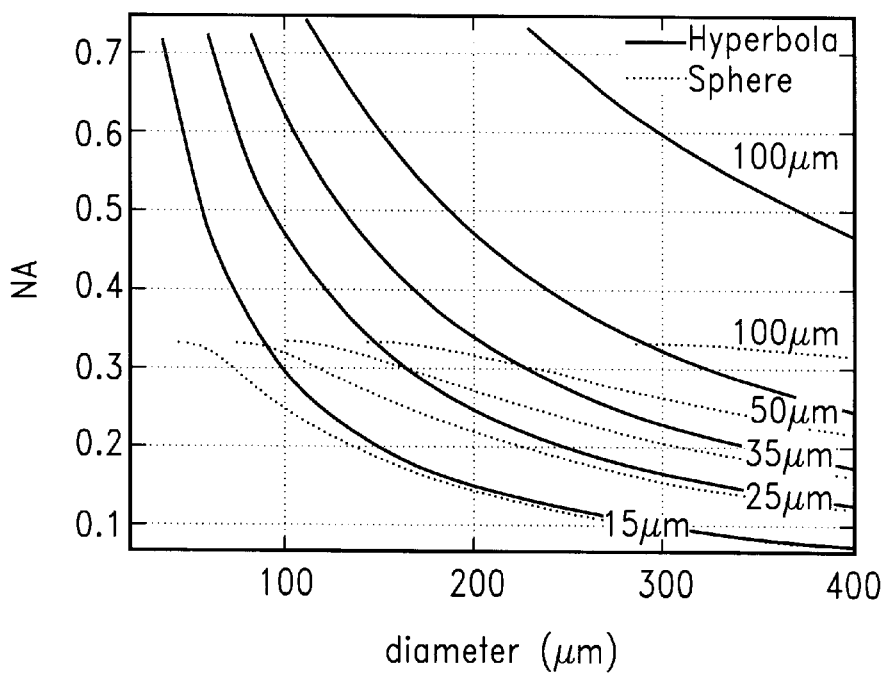
FIG. 2B is a graph which illustrates the surface sags required for specific NAs and diameters.

FIG. 2B illustrates the relationship between diameter and NA for microlenses with spherical and hyperbolic surface-relief profiles for elements that have a maximum sag of 16, 25, 35, 50, and 100 $\mu$m of sag. In calculating the curves for FIG. 2B, indices of refraction of $n_1=1$ and $n_2=1.5$ were chosen. One notes that a spherical refractive surface is only able to attain a numerical aperture of 0.32. One also notes that the numerical aperture of a system (e.g., optical fiber or laser diode source) does not have to be very large before the surface sag required exceeds 15 $\mu$m. For example, a microlens that is only 300 $\mu$m in diameter requires a surface sag of 15 $\mu$m in order to operate at NA=0.1, and a surface sag of 25 $\mu$m in order to obtain NA=0.25. Although FIG. 2B only illustrates examples of hyperbolic and spherical surfaces, it should be reiterated that the current invention is by no means limited to these profile shapes. The patterning of surface-relief structures with elliptical, cylindrical, and arbitrary profiles involving the use of Zernike polynomials are but a few of the surfaces that can be achieved. The invention described by this patent allows one to fabricate such deep-sag, arbitrary profile microlenses that one can build and assemble micro-optical systems with the minimum amount of wave front error. One can also fabricate non-optical profiles such as alignment marks.

Figure 3A:
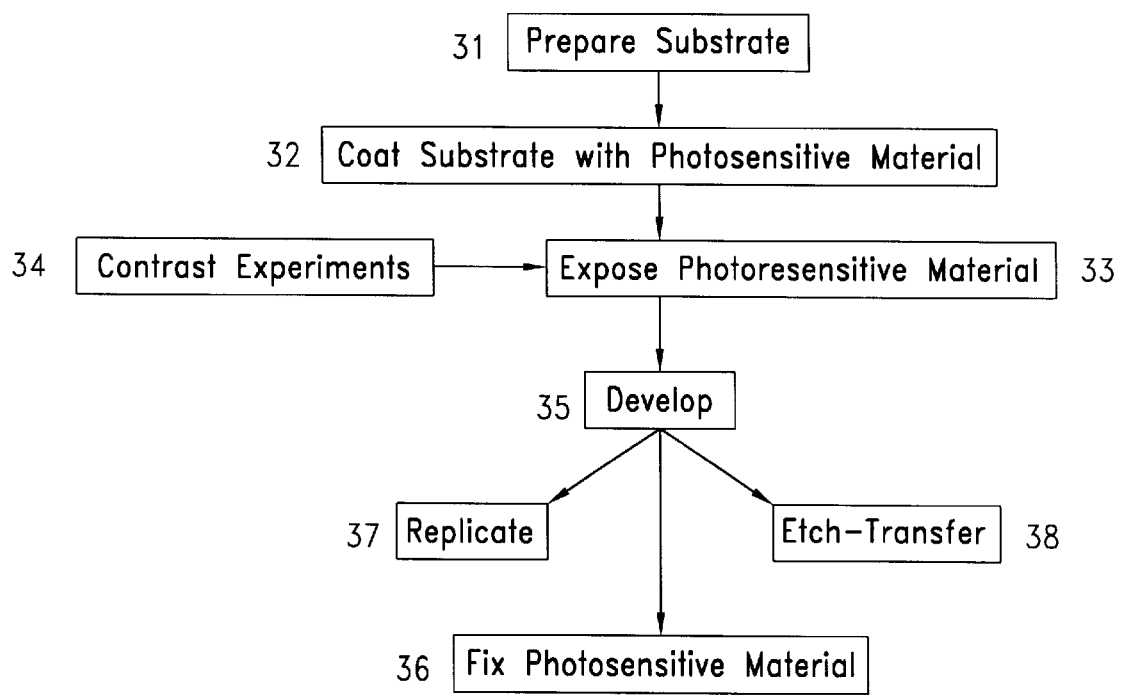
Figure 3B:
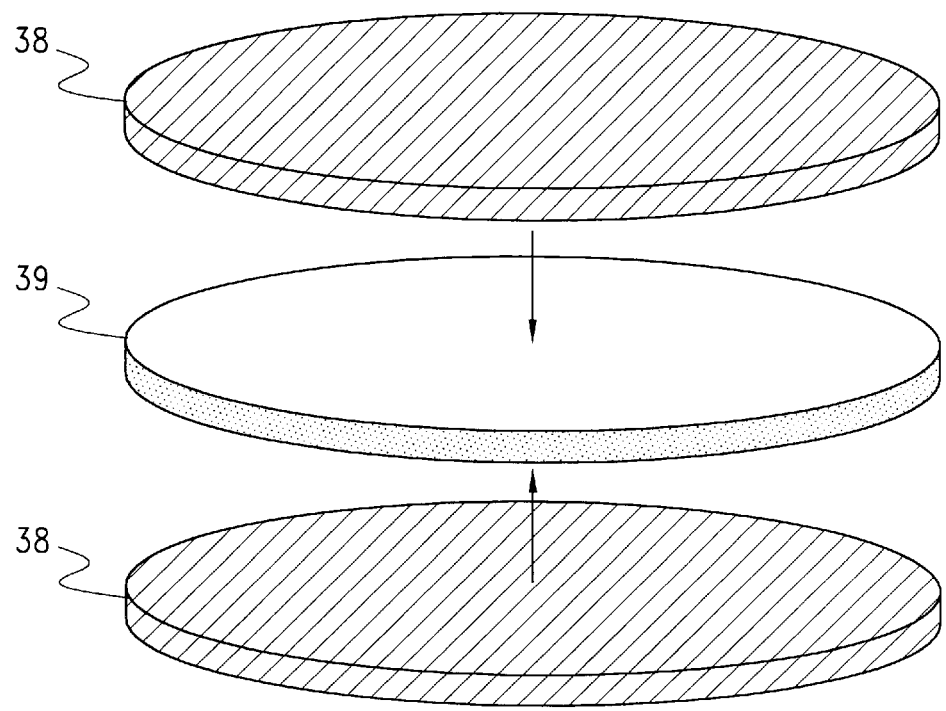
Figure 3C:
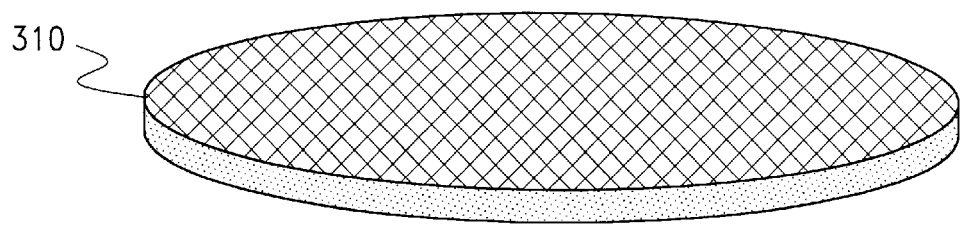

Steps for the exposure of a photosensitive material are illustrated in FIG. 3. One first prepares a given substrate by (Step 31) cleaning the surface to promote adhesion of the photosensitive material, as well as to reduce the probability of defects caused by surface contamination. The cleaning process is dependent upon the substrate in question and can involve the use of solvents, acid solutions, ozone, etc. The cleaner the environment, the less contamination the substrate will contain that may interfere with the proper production of the desired microstructures. After the cleaning process, the dehydration bake is typically performed on a hot plate or in an oven to remove any residual volatiles or water on the surface. Once the substrate surface is prepared by Step 31, the photosensitive material in the form of a film is coated on the surface (Step 32). This can involve a variety of coating techniques that will be discussed in more detail later. The exposure of the surface (Step 33) is performed based upon the contrast of the photosensitive material. In other words, experimentally in step 34, one determines the exposure dosage required to achieve a specific response from the photosensitive material as a function of the coating parameters, the specific method of exposure, and the developing parameters. Once exposed, the photosensitive material is developed in step 35, typically in an aqueous solution and the desired surface-relief pattern is obtained. For certain applications, the photosensitive material may be suitable as the final medium for the delivered microstructured surface. In these cases, the photosensitive material may require additional fixing (Step 36) in order to make the material physically more durable as well as to make the material resistant to solvents. This may involve further oven bakes, UV exposures, or other treatments. For other applications (especially for high volume production) the final medium may be a polymer. The microstructured photosensitive material can then be replicated (Step 37) via a cast-and-cure process, compression molding, injection molding, or compression injection molding. This typically involves first transferring the relief-pattern of the original photosensitive material into a more durable medium. To transfer the pattern into metal, an electroforming process can be conducted. One can also etch-transfer (Step 38) the photosensitive material into the underlying substrate using a dry etching process such as reactive ion etching (RIE), ion milling, chemically assisted ion beam etching (CAIBE), or reactive ion beam etching (RIBE). The etched substrate can be used to create replicas as an embossing tool, or can be used as the final product itself. In this manner, although the photosensitive surface may not meet the operational requirements of a specific optical system (temperature range, optical throughput, laser damage threshold, etc.), the etch-patterned substrate (substrate material may be Ge, Si, $SiO_2$—, ZnS, ZnSe, etc.) can. The process may continue by forming masters, using alignment marks, and sandwiching the duplicates together to form microlenses as shown in FIG. 3B.

The manufacturing process is conducive to volume manufacturing. For telecommunications and optical data storage systems, volumes of micro-optical elements can be in the millions, so it is imperative that one produce the desired optical elements in a cost-effective manner. The manufacturing method described in this patent relates to a method for fabricating high-precision, arbitrary surface-relief patterned masters from which high-volume replicas can be created. FIG. 3B illustrates a set of replication tools 38 that can be used to replicate a wafer 39. The wafer can have a polymer coating that is embossed by the replication tools, or through a cast-and-cure method so that one can achieve the desired surface-relief profiles. Once both sides of a wafer are replicated to achieve the desired micro-optical system (such as those represented by FIGS. 1A and 2B, for example) one can dice the wafer 310 into sub-apertures, thereby achieving hundreds of micro-optical systems for each wafer processed. For applications that require non-polymer materials, one may pattern wafers with a multitude of optical elements, etch the entire wafer simultaneously, and then dice the wafer into components. Other variations of this wafer processing technique for high-volume applications are obvious to those skilled in the art.

Figure 4:
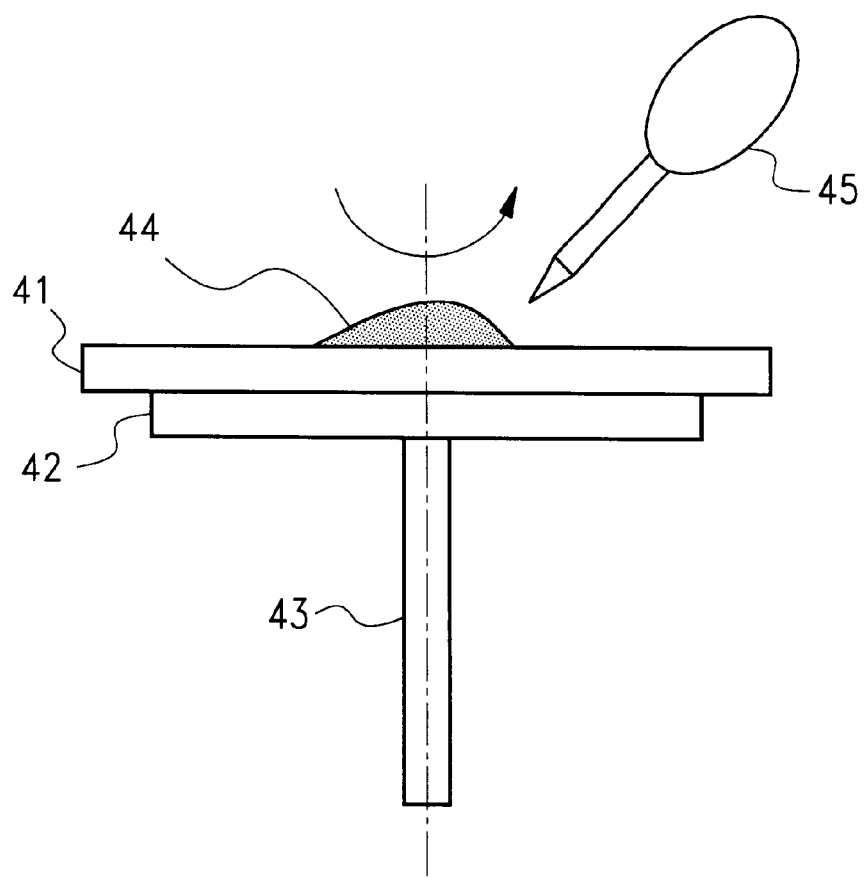
FIG. 4 is a schematic diagram which illustrates the spin-coating method of coating a photosensitive material.

FIG. 4 illustrates how photosensitive materials can be spin-coated onto a given substrate. For illustrative purposes, we will discuss photoresist, wherein the photosensitive material is suspended in a solvent solution. Commercial spin coating machines can be obtained by such vendors as Headway Research, Inc., Garland, Tex., and Karl Suss America, Inc., Waterbury Center, Vt., and provide the best method for achieving uniform coatings ($\lambda/10$ or less@HeNe) across flat substrates. A schematic of a spin-coater is illustrated in FIG. 4. A substrate 41 is placed onto a chuck 42 that is mounted to a motor spindle 43. The substrate is held in place by vacuum, mechanically, or by both methods. The spin-coating process itself involves a dispense stage, a spreader stage, and final spin stage. In the dispense stage, photoresist 44 is applied using a spray, a pipette 45, or by any other means of placing a puddle of the photosensitive material onto the substrate surface. This coating process is performed either statically (the substrate being stationary) or dynamically (the substrate rotating at a slow rpm). Once dispensed, the photoresist is spun at either the final desired rpm, or is first spun for a short amount of time (approximately 5–10 seconds) at a lower rpm, to spread the photoresist out over substrate 41 in what is termed a spreading stage. This spreading stage is particularly useful for thicker photoresists to ensure that the resist is first spread across the substrate uniformly before the spinner is moved to the final rpm stage. In moving to the final rpm stage, the time of acceleration is another parameter that can be varied to make a more reliable process. To ensure proper spin uniformity, one wants to make sure that the atmosphere of the spinner bowl is saturated with vapor. In this manner inhibited drying is achieved to help ensure that during the coating process no portion of the photoresist partially dries before the final spin stage. The final thickness of the photoresist is determined by the concentration and the viscosity of the photoresist and the rpm of the final spin stage.

Figure 5A:
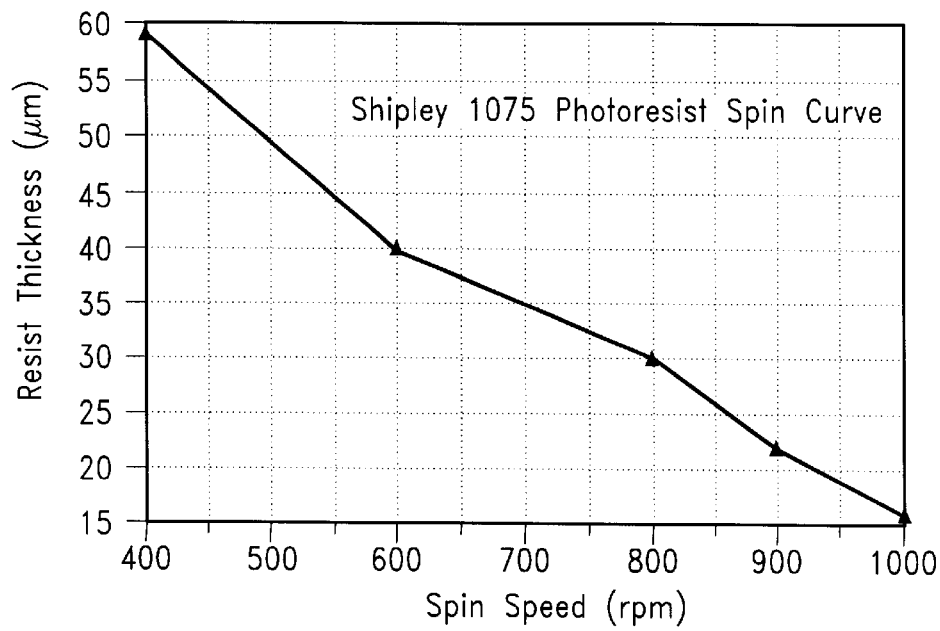
FIGS. 5A and 5B depict spin coating curves for Shipley 1075 photoresist and SU8 photoresist, respectively. The curves represent the photoresist film thickness as a function of rpm of the spin coater.
Figure 5B:
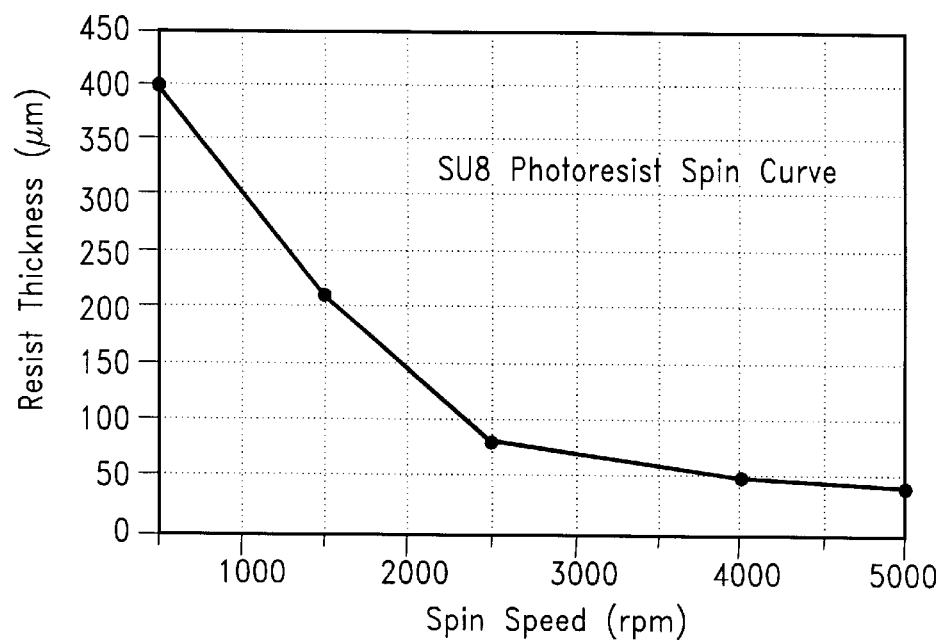

Illustrated in FIGS. 5A–5B are spin curves for suitable commercially available photoresists, including (a) Shipley 1075 photoresist, available from the Shipley Co., Inc. of Marlborough, Mass., as well as for (b) SU8, available from Lithography Chemical Corp. of Watertown, Mass. The curves illustrate the film thickness achieved as a function of spinner rpm. For spin-coating, the film thickness t achieved generally follow a curve given by $$t = \frac{KC^\beta V^\gamma}{\omega^\alpha}$$

where $\omega$ is the spin speed, C is the material concentration in the solvent, V is the viscosity and $\alpha$, $\beta$, and $\gamma$ are constants. Consequently, given a particular photosenstive material solution of a certain concentration and viscosity, one can calculate the film thickness as a function of spin speed (rpm).

After the photoresist is spin-coated, the substrate is baked (typically called a soft bake or a pre-bake) in order to remove residual solvents and to anneal any stress in the photoresist film. This step controls the sensitivity of the photoresist. A longer and hotter soft bake will tend to reduce the sensitivity of the film, but a too short or a too cool baking temperature will leave residual solvents in the resist film that will affect the profiles of the final microstructures. Typically soft bake temperatures are in the 90° to 110° C. range and the bake times are a few minutes for a hot plate, to 30 minutes to several hours for a convection oven. To ensure that the photoresist layer does not develop a slight wedge during the baking process, one should make the horizontal surfaces of the convection oven or hot plate level.

When processing thick photoresist (>15 μm) the photoresist-coated substrates are preferably allowed to set out for what is termed a relaxation stage prior to the soft-bake step. This waiting period is typically on the order of 30 minutes, and helps reduce stresses in the thick photoresist film.

For thick photoresist, hot plate soft bakes are preferential since the photoresist heating is occurring from the bottom of the film to the top. In this manner solvents are not trapped by the skinning of the photoresist top that can occur with oven bakes. For thick photoresist, one also wants to use a hot plate with a ramping feature so that the resist is slowly ramped up to its soft baking temperature thereby reducing the chance of solvent bubbles forming in the photoresist.

An example of a suitable photoresist coating recipe is:

1. Clean substrate
2. Dispense Shipley 1075 photoresist onto a clean substrate using a large pipette.
3. Spread stage: 200 rpm for 30 seconds.
4. Final stage: 500 rpm for 3 minutes.
5. Relaxation stage: Let substrate sit for 30 minutes.
6. Soft bake: Hot plate for 90° C. for 10 minutes.

From FIG. 5, one notes that the above recipe will result in a photoresist film thickness that is 50 μm in thickness.

FIG. 6 illustrates other techniques for depositing photoresist, which may be preferable for coating non-plano substrates. These coating methods include meniscus coating, dip coating, vacuum coating, electroplating, and spray coating. In meniscus coating (see FIG. 6A) the substrate 61 is mounted horizontally below a roller 62. Photoresist 63 is deposited on the roller, creating a meniscus above the substrate. By translating the roller, and hence the meniscus above the substrate, one can coat the substrate with a layer of photoresist 64 which is uniform to typically 5–10%.

In dip coating, see (FIG. 6B) the substrate 65 is held in place by a clamp 66. This clamp is mounted to a cantilever arm 67 which translates up and down along a rail 68. In this manner, the substrate assembly can be dipped into a container 69 that holds photoresist 610. Controlled pulling of the substrate out of the solution is required in order to achieve a uniform, non-striated film coating. Once pulled out of the solution, the film is baked. In order to achieve thick films, higher viscosity material can be used, but more typically the substrate, once dipped, and once the resulting coating is at least partially dried, is dipped again. This process is repeated until the desired film thickness is achieved. Manufacturers of dip coaters include Chemat Technology, Inc. of Northridge, Calif. This dip method may be used for coating plano and non-plano surfaces with photoresist films greater than 15 μm in thickness.

Figure 6A:
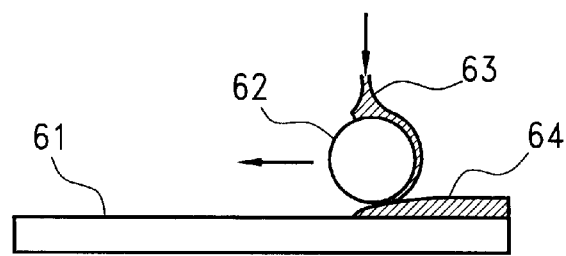
FIGS. 6A–6E are diagrams of several coating steps which may be used in practicing the invention; meniscus coating, dip coating, vacuum coating, electroplating, and spray coating processes being illustrated in FIGS. 6A–6E, respectively.
Figure 6B:
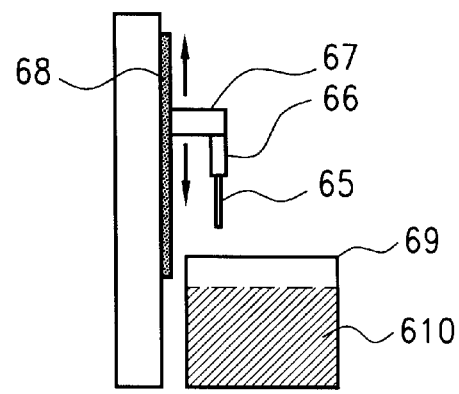
Figure 6C:
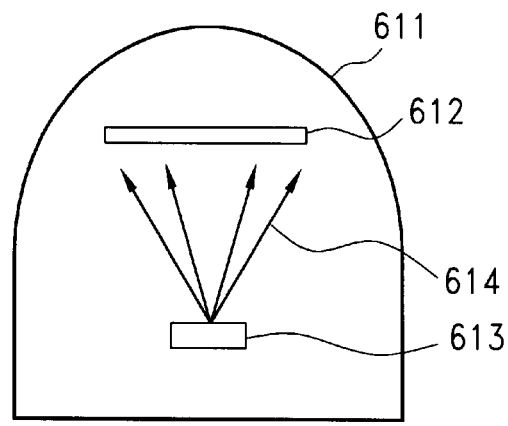

FIG. 6C illustrates vacuum depositing of a photosensitive film. In vacuum deposition, the substrate 612 is placed into a vacuum chamber 611 that contains a source 613 of the material to coat. The source can be heated electrically or an ion or electron gun can be used to sputter the material 614 onto the substrate.

Figure 6D:
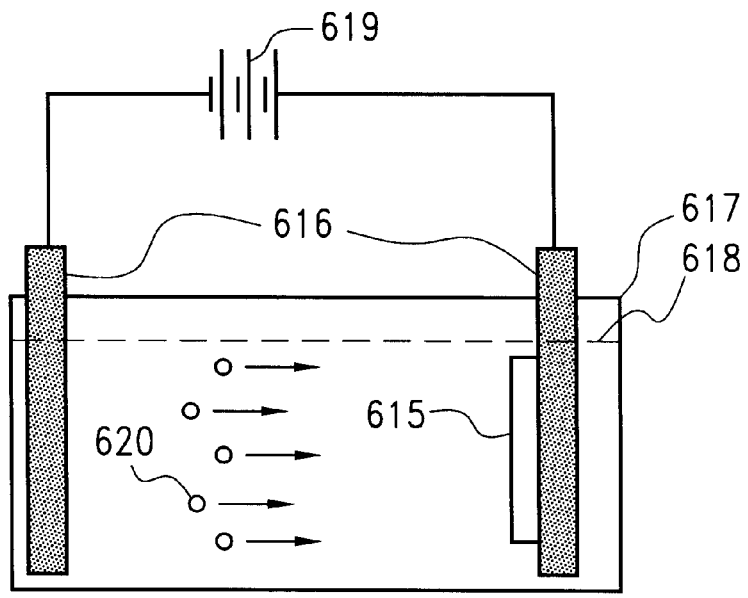

FIG. 6D illustrates an electroplating technique which involves taking a conductive substrate 615 and mounting it to an electrode 616. The electrode is placed in a container 616 that holds an electroplating solution. The substrate is mounted such that it is below the fluid level 618 of the solution. A potential difference is created between the two electrodes using a power supply 619. Due to this potential difference between the bath and substrate, the photoresist solution 620 plates onto the substrate. The resist thickness achieved depends upon numerous plating parameters such as applied voltage, bath temperature, and electroplating time. Photoresist conducive to electroplating is sold by Shipley as PEPR 2400 positive tone and Eagle 200 ED negative tone. The electroplating process is particularly useful for coating non-plano substrates. The electroplating method may be used to coat photoresists with thickness over 15 μm.

Figure 6E:
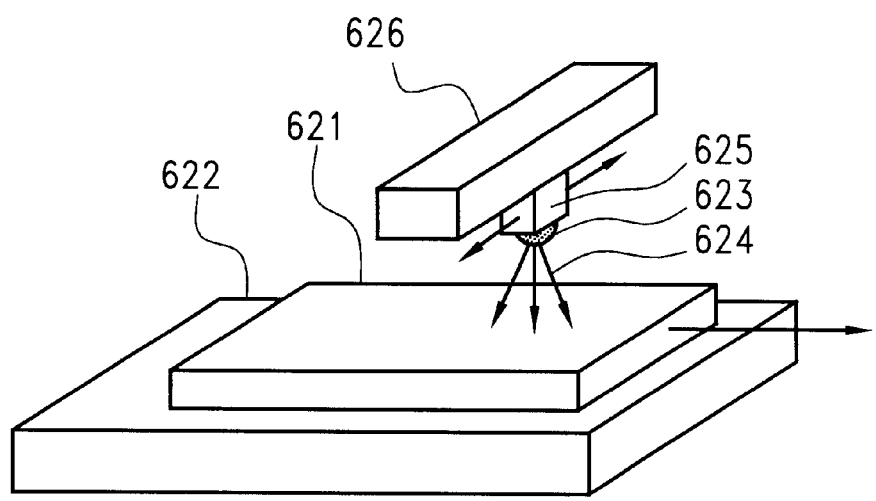

Photoresist can also be coated onto a substrate using a spray method as shown in FIG. 6E. Machines for spray-coating photoresist can be obtained from such vendors as Specialty Coating Systems (SCS) of Indianapolis, Ind. A substrate 621 is placed on a mechanical stage, conveyor belt, or roller 622. Above the substrate is a spray nozzle 623 that is mounted to an arm 625 that travels laterally along a rail 626. The photoresist 624 is sprayed onto the substrate as the spray nozzle translates in a motion perpendicular to the substrate translation axis. Additional axes of motion may be added to the spray arm 625 in order to allow for the coating of non-flat substrates. The spray thicknesses depend upon multiple parameters such as spray velocity, nozzle shape, distance of spray nozzle to substrate, and velocity of the mechanics. In order to create films of thickness greater than 15 μm, one cannot necessarily use photoresists of a higher viscosity due to the tendency for the spray nozzle to become clogged. Rather, one can spray multiple coatings with a suitable bake step in between, or one can reduce the velocities of the mechanics in order to coat thicker layers in one step. The spray-coating method may be used for achieving resist films greater than 15 μm, but this method is not preferred because the uniformity may not be as good for plano substrates as in the spin-coating method. However, spray coating does have advantages for non-plano substrates.

Once coated, the photoresist is ready to be exposed to a varying dose of energy. As mentioned earlier, this can be achieved using a laser pattern generator, grayscale photolithography, translating apertures during exposure or holographically.

Figure 7:
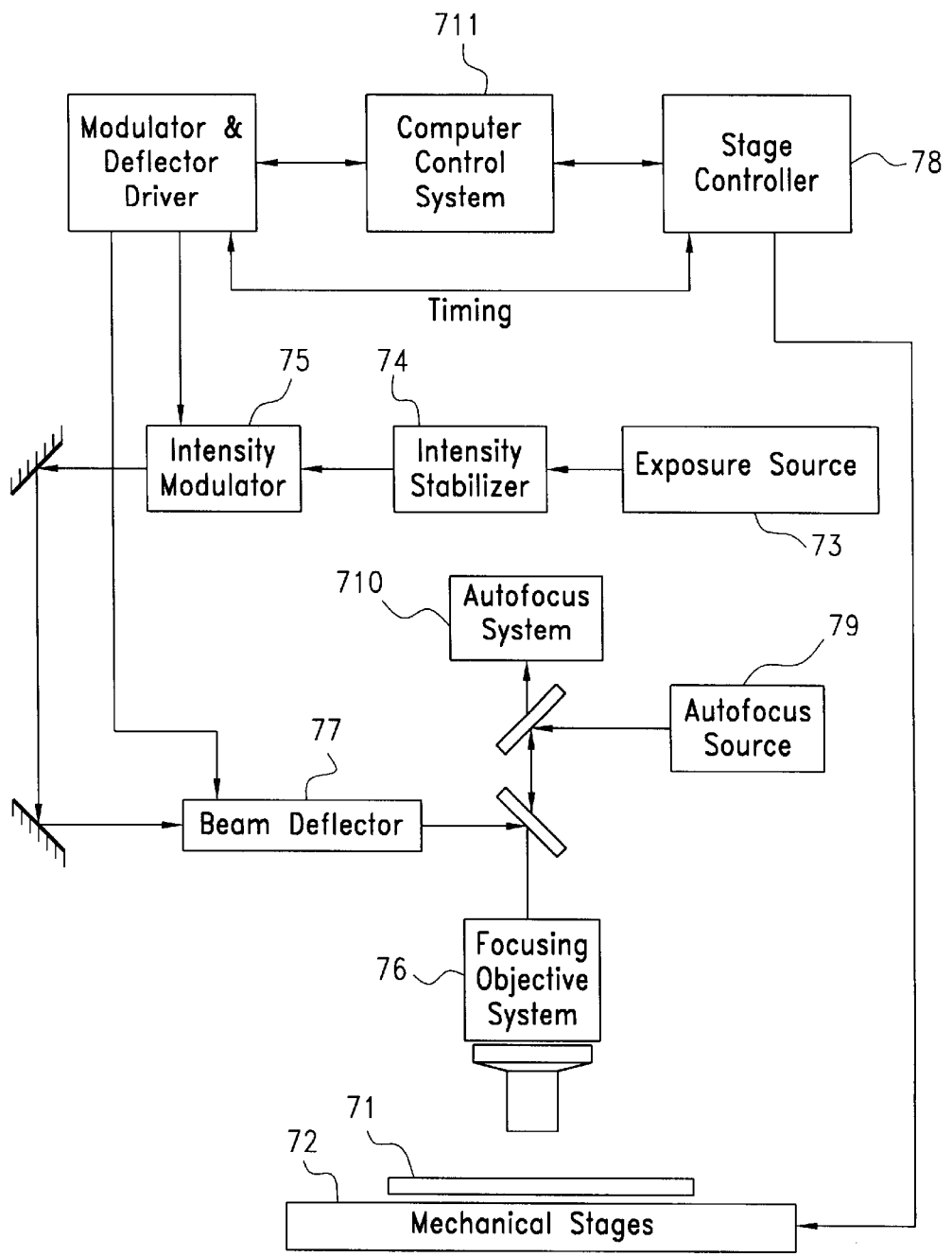
FIG. 7 is a schematic diagram of a laser pattern generator used for the exposure of photosensitive material in accordance with the invention.

FIG. 7 illustrates schematically a laser pattern generator. This device will pattern a photosensitive substrate 71 mounted on mechanical stages 72 with a given exposure dosage as a function of the surface's spatial coordinates. Typically the exposure source 73 for such an instrument is a laser. For photoresist that is sensitive in the blue or UV portions of the electromagnetic spectrum, the radiation source used is typically an argon-ion, krypton-ion, or helium-cadmium laser. With advances in semiconductor laser diodes, these gas lasers will most likely be replaced in the design of LPGs. The exposure source is intensity stabilized using a noise-eater 74 and is then modulated using an acoustopic modulator or an electro-optic modulator 75. Note that although a single beam is being illustrated passing through its own intensity modulator, a multi-beam geometry is advantageous for increasing the writing speed of the LPG. Once modulated, the exposure beam or beams can be passed directly into a focusing objective 76, or they can first pass through a beam deflector 77 such as a set of mechanical galvos or AO deflector. The beam deflector 77 along with the intensity modulator 75 are computer-controlled 711 and timed with the stage controller 78 to ensure that the appropriate exposure dosage mapping on the photosensitive substrate is achieved. The focusing of the exposure source onto the substrate is monitored through the use of an auto-focus source 79 and detector 710. In the case of photoresist that is not sensitive to radiation above 500 nm in wavelength, one can use a red or near-IR semiconductor laser as the auto-focus radiation source. This auto-focus system allows one to ensure that the exposure spot is accurately focused onto the substrate surface. This is particularly critical for high-NA systems, wherein the depth of focus is sub-micron.

FIG. 8 illustrates two different geometries for grayscale mask lithography: (a) contact or proximity lithography and (b) projection lithography. In either geometry, an exposure source 81 is collimated using a condenser optical system 82 that can consist of any combination of lenses and reflective mirrors. The illumination radiation 83 is then incident upon a reticle or a photo mask 84 that has a transmission that varies as a function of location across the mask clear aperture. The radiation transmitted (or reflected) by the grayscale reticle is thereby intensity modulated. In the case of contact or proximity printing, see FIG. 8A, the transmitted radiation propagates in free space and exposes a substrate 85 coated with a photosensitive material 86. The photo mask can either be put directly in contact with the substrate (contact-printing), or a small gap (typically on the order of a micron) is made between the mask and the coated substrate in order to reduce the probability of contamination (proximity printing). In the case of projection lithography an imaging optical system 87 that consists of one or more refractive and reflective optical elements is used to project the transmitted (or reflected) image of the grayscale reticle 84 onto the photosensitive substrate 85, 86.

Figure 9:
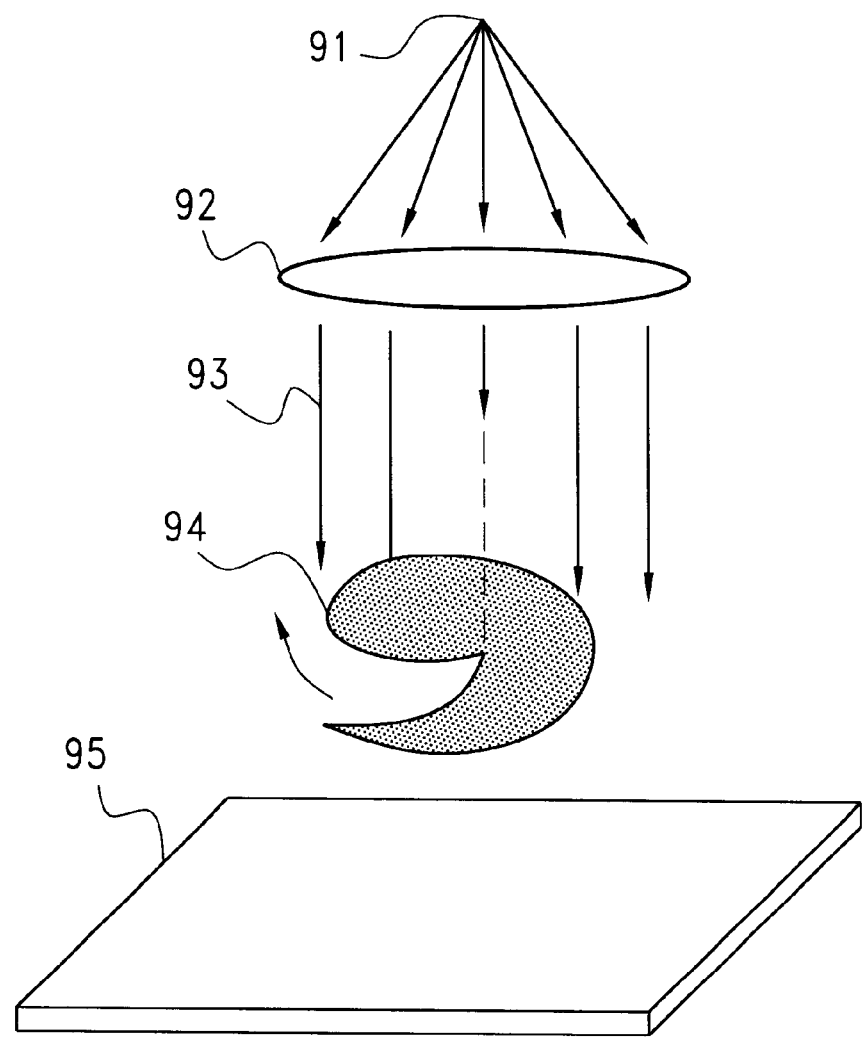
FIG. 9 is schematic diagram which depicts the step of exposing photosensitive materials to a spatially variable electromagnetic exposure dosage through the use of rotating masks in accordance with an embodiment of the invention.

FIG. 9 illustrates exposing a photosensitive material 95 with a rotating mask 94. First an exposure source 91 is collimated by a lens or lens system 92. The collimated radiation 93 is incident upon a mask 94. In FIG. 9 we have illustrated a mask that consists of only opaque or clear areas in the form of a spiral. In general, one can have a grayscale mask. By rotating the mask such that the rotation time is short compared to the total exposure time, one can use a binary mask (either opaque or clear) to create a grayscale exposure of a photosensitive material. Note also that, one can construct a mask which is not merely rotated, but could also be translated for the exposure required to create a cylindrical lens.

FIG. 10 illustrates several different methods for developing a photoresist that include (a) puddle developing, (b) spray developing, and (c) dip or immersion developing. In puddle developing, the resist-coated 102 substrate 103 is mounted onto a vacuum or mechanical chuck 104 that is on a rotary spindle 105. Using a pipette 106 or any other means the developer solution 101 is deposited onto the substrate surface and left to sit for 30 seconds up to several minutes. After this period of time, the residual developer is spun off, and typically deionized (DI) water is sprayed onto the substrate to rinse the substrate during the spin step. Once rinsed, the DI water spray is shut off, and the substrate is allowed to spin dry. FIG. 10B illustrates spray developing. Again, a resist-coated 1010 substrate 1011 is mounted to a vacuum or mechanical chuck 1012 that is mounted to a rotary spindle 1013. While the substrate is spinning, developer 108 is sprayed onto the substrate using a spray nozzle 107 for a set period of time. Since the substrate is spinning, the solution developing the photoresist 109 is constantly being sheeted off of the substrate, and fresh developer is being sprayed on. After the developing stage, the rinse and dry stage is performed as for the puddle developing process. FIG. 10C illustrates a dip or immersion method of developing resist-coated substrates. A resist-coated substrate 1015, after being exposed, is secured to a holder 1014 by mechanical or vacuum means. This holder is immersed into a container 1016 the contains the photoresist developer such that the substrate is below the fluid line 1017. During the development process, the substrate is typically gently agitated in the developer solution. After the development time has expired, the substrate still secured by the holder is lifted out of the developer solution and into a container 1018 that has DI water for the rinse stage. Again, the substrate is dipped below the water level line 1019 and gently agitated for tens of seconds to rinse the resist surface. After the rinse stage, the substrate can be spun dry, or dried through the use of compressed air or nitrogen guns.

In order to create the microstructure desired using any of the coating, exposing, and developing methods described, one needs to determine the manufacturing parameters required in order to achieve a desired developed depth in a particular photosensitive material.

This response or contrast curve of the photosensitive material is a function of the exposure power, wavelength, incident polarization, and collimation, and it is also highly dependent upon the photosensitive material used, the substrate the material is coated onto, as well as the specific coating and development procedures. The index of reaction, both real and imaginary portions, in addition to the incident polarization and collimation of the radiation beam, determine how much energy is transmitted into the photoresist film and how much is absorbed. If the photoresist is coated onto a reflective substrate, then the film will be exposed to a higher energy dose due to increased back reflections. Changing coating parameters (e.g., soft bake times and temperatures) or changing development parameters (e.g., developer solutions, times, and temperatures) will change the sensitivity of the photoresist and therefore the developed depth.

Figure 11A:
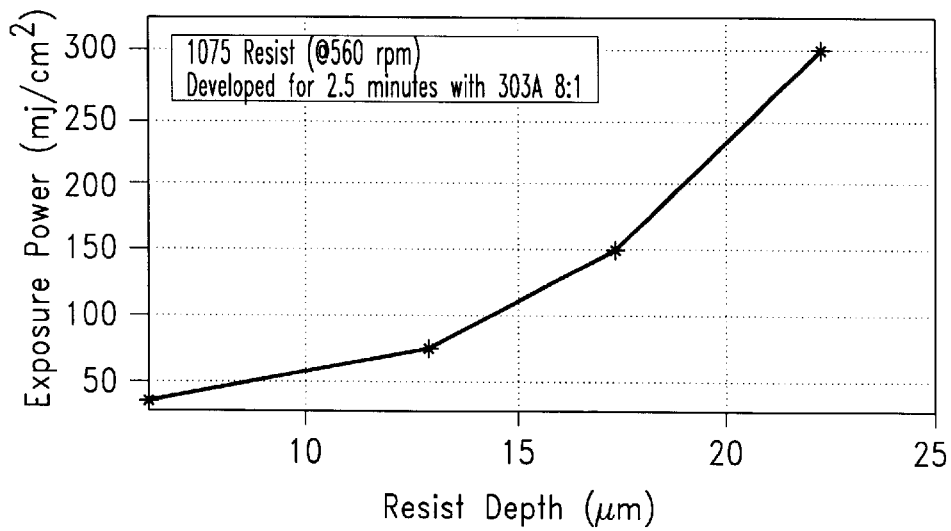
FIGS. 11A and 11B illustrate photoresist contrast curves that may be used to achieve arbitrary surface-relief structures along with several multilevel and continuous-relief profiles that allow one to achieve profiles having heights exceeding 15 $\mu$m.
Figure 11B:
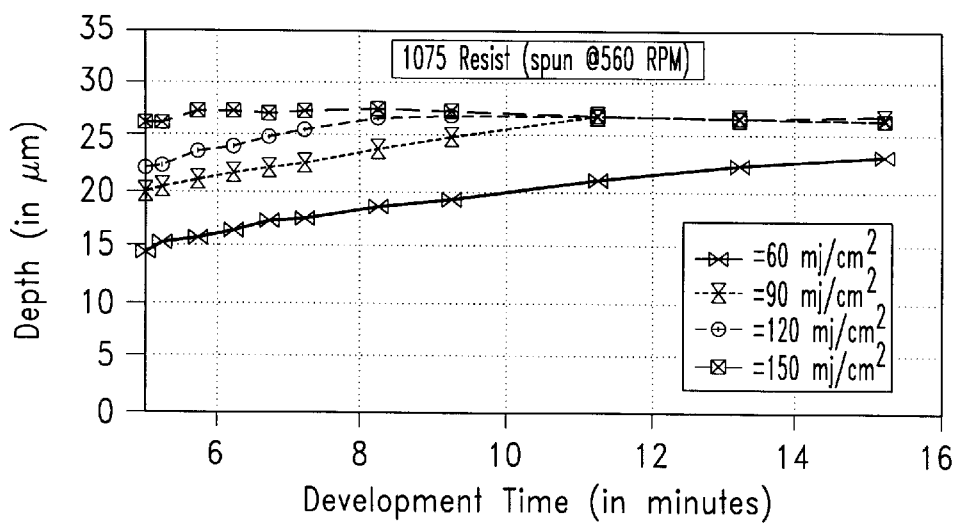

Once one has chosen a particular photosensitive material, a method for coating a surface with said material, a specific substrate material, exposure geometry, and a development method, one must conduct experiments to determine the response curves required in order to achieve specific continuous relief surface profiles. FIG. 11A illustrates a response curve obtained for the exposure of Shipley 1075 photoresist to a LPG. The exposure parameters were such that $\lambda=0.4416$ $\mu$m radiation was used with a N.A.=0.6 objection. The resist was spin-coated at 560 rpm and soft baked at 90° C. for 10 minutes on a hot plate. The development procedure used was an immersion technique wherein the exposed substrate was developed in a solution of DI:Shipley 303A (8:1) for 2.5 minutes. The curve in FIG. 11A illustrates how exposure energies from 40 to 300 mJ/cm$^2$ result in photoresist depths that vary from 1 $\mu$m to 22 $\mu$m in depth. FIG. 11B illustrates how development depth varies as a function of development time. In this scenario, substrates with about 27 $\mu$m of Shipley 1075 photoresist were exposed to RPC's laser pattern generator (same parameters as for FIG. 11A). The curves illustrate the development time (in a DI:Shipley 303A 8:1 solution) and energy in mJ/cm$^2$ required to reach a specific depth in resist. Similar curves can be generated for other forms of exposure geometries, such as the grayscale lithography and translating mask exposure as illustrated in FIGS. 8 and 9, respectively. Data from curves such as those illustrated in FIG. 11 can be used to determine the proper exposure dose and development procedure to use given a specific photosensitive material and coating procedure to fabricate arbitrary microstructures.

Figure 12:
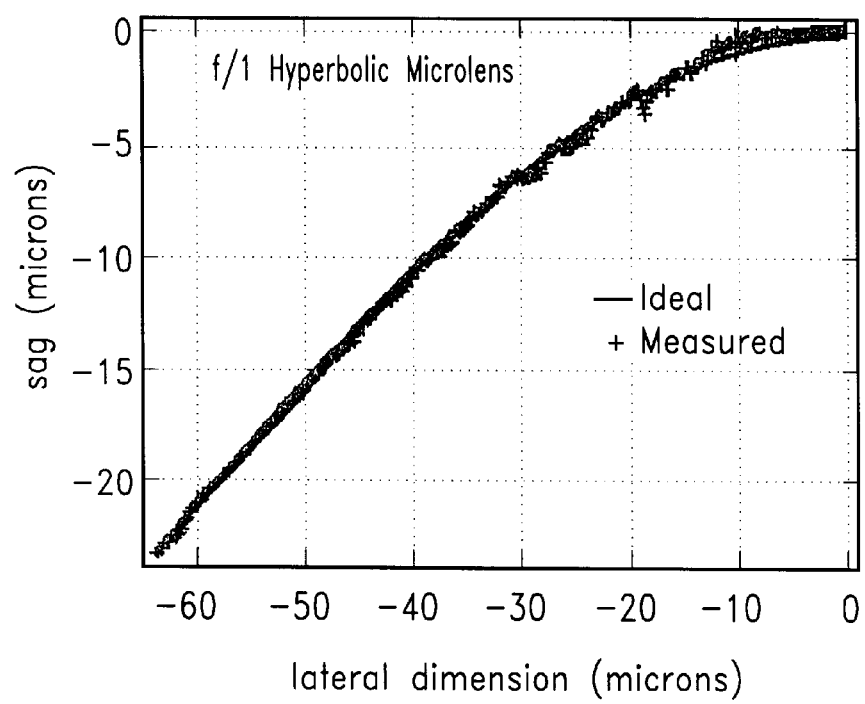
FIG. 12 shows two curves of theoretical and fabricated surface profiles for an f/1 hyperbolic microlens. By comparing these curves, one can fine-tune the predicted response curve of the photosensitive material being exposed and developed.
Figure 13A:
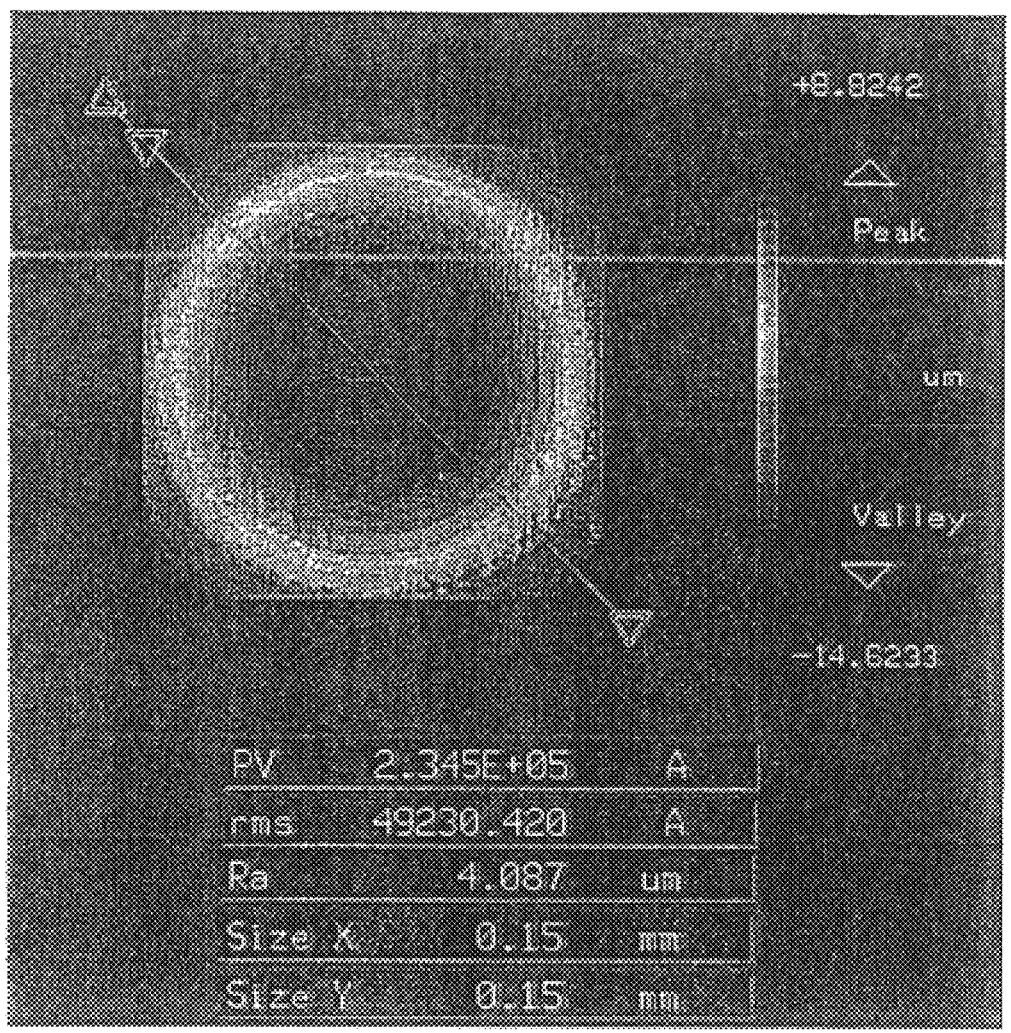
FIGS. 13A–13C are plots of optical profilometry data for a spherical microlens fabricated by patterning photoresist with an x-y laser pattern generator in accordance with the invention.
Figure 13B:
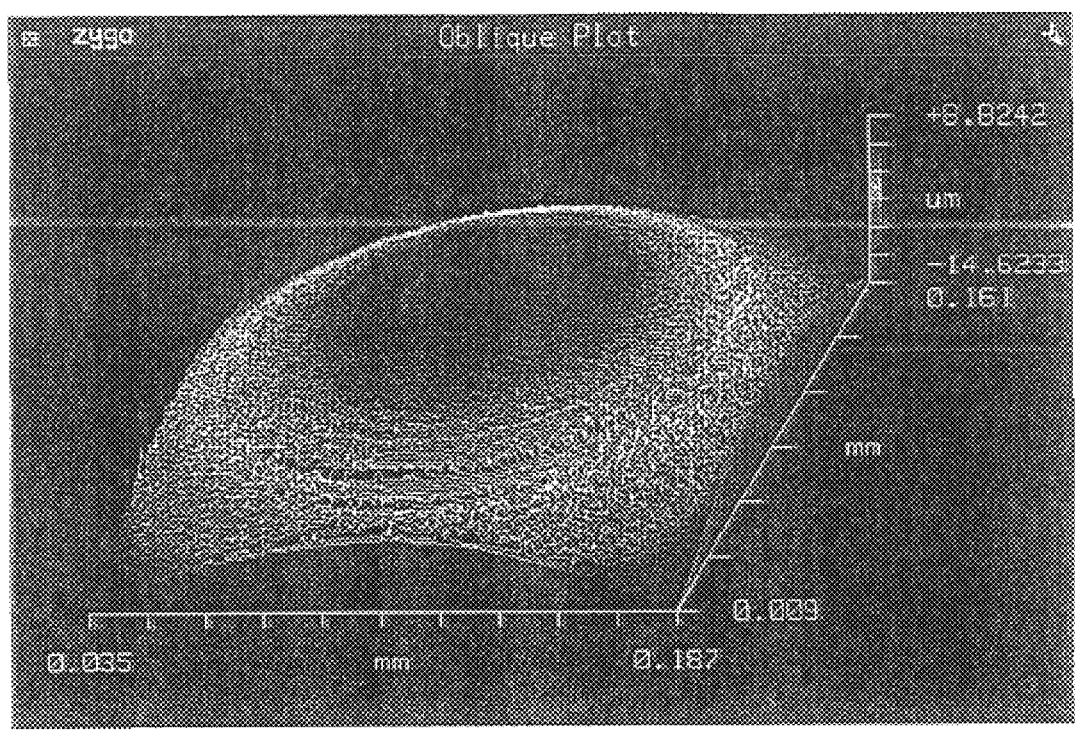
Figure 13C:
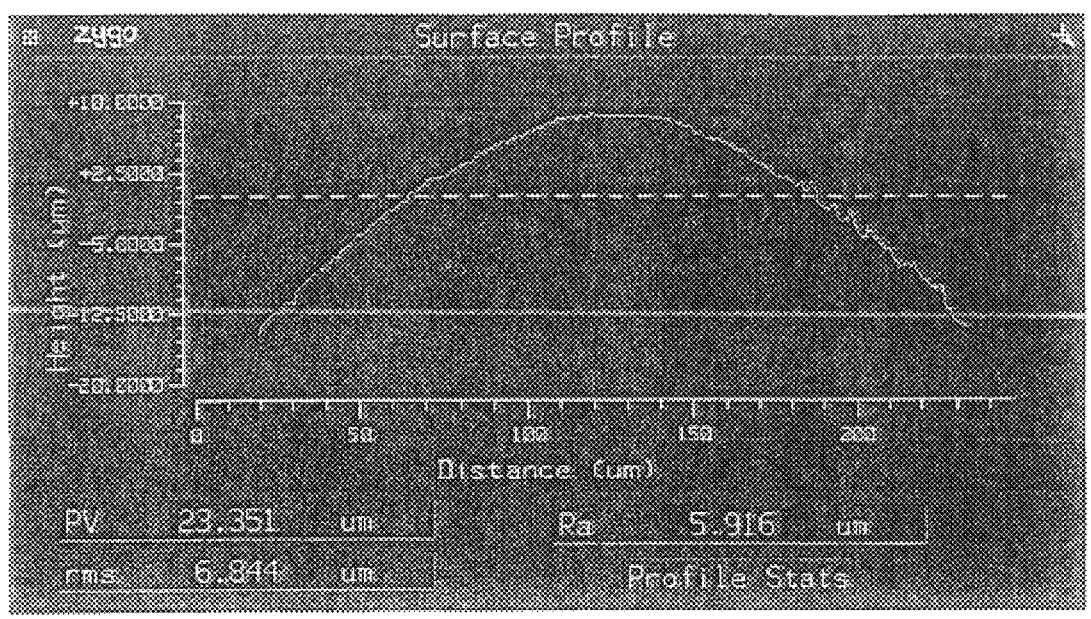

FIG. 12 illustrates white-light surface profilometry data for a f/1 hyperbolic lens that RPC fabricated using its laser pattern generator. The sag of the surface in microns is illustrated versus the radial coordinate of the lens in microns. One can use profilometry data to determine how well the fabricated profile matches that of the desired profile. Deviations can be fixed most easily by changing the look-up table or exposure dose as a function of position on the substrate surface. In the example illustrated, one notes that the deviation between the fabricated and ideal surface is less than 0.5 $\mu$m, and that the total sag of the photoresist microlens is roughly 24 $\mu$m FIG. 13 illustrates optical profilometry data for a f/2 spherical microlens. In FIG. 13A the top-down contour map of the microlens is illustrated, while FIG. 13B illustrates a 3-D view of the surface. In FIG. 13B, the line trace of the diagonal of the surface is depicted, illustrating a total surface sag of 23.2 $\mu$m. This microlens was patterned with RPC's x-y LPG using Shipley 1075 photoresist.

Figure 14A:
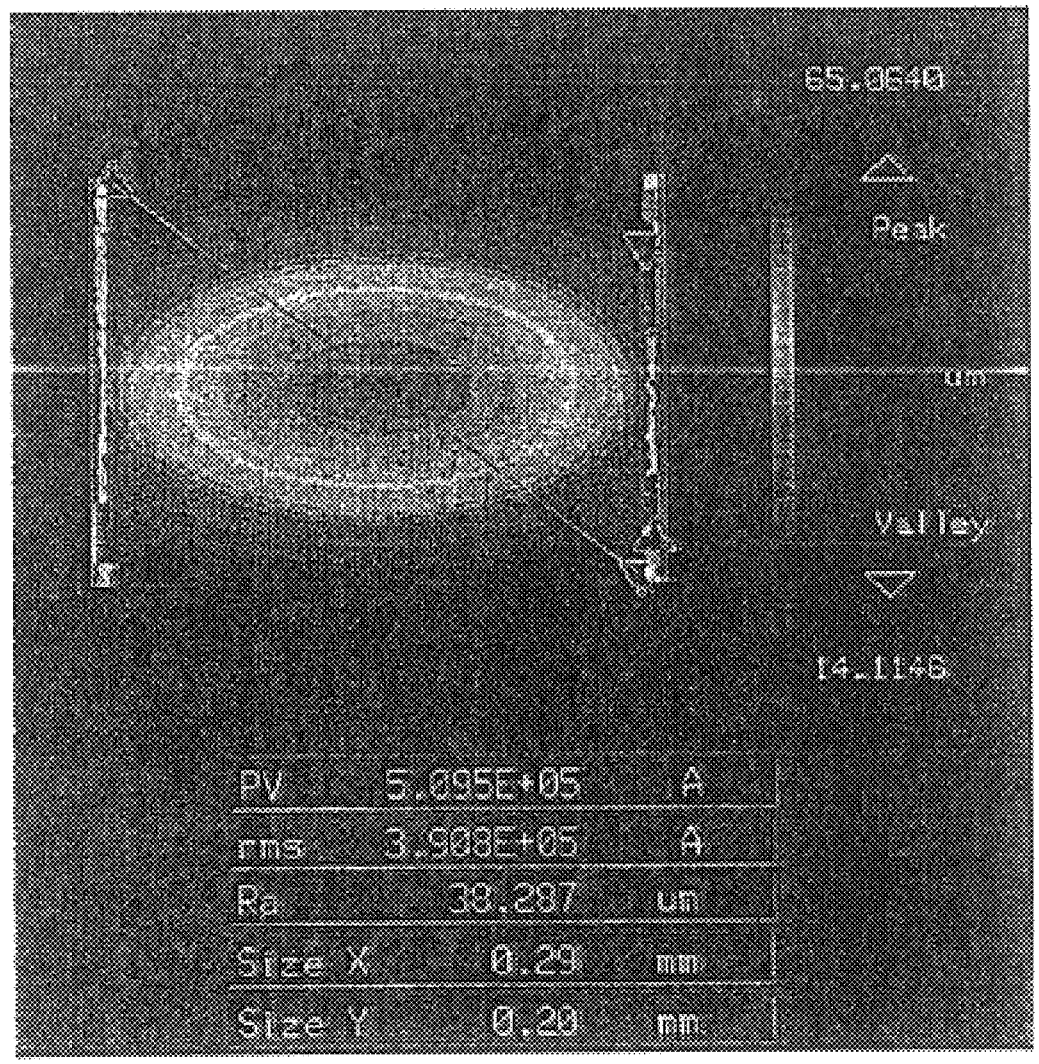
FIGS. 14A and 14C are plots similar to those of FIG. 13 of optical profilometry data for a toroidal microlens fabricated by patterning photoresist with an x-y laser pattern generator. Such lenses are advantageous when collimating and/or circularizing anamorphic radiation sources such as a laser diode, as described in the above-referenced related patent application.
Figure 14B:
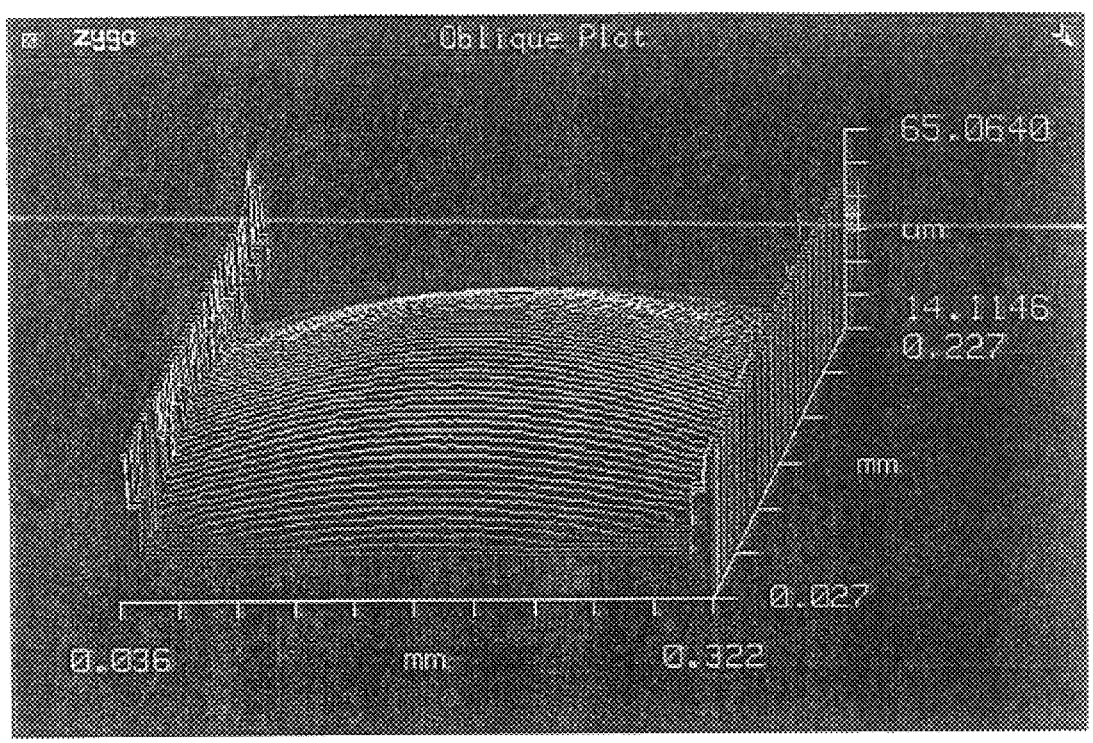
Figure 14C:
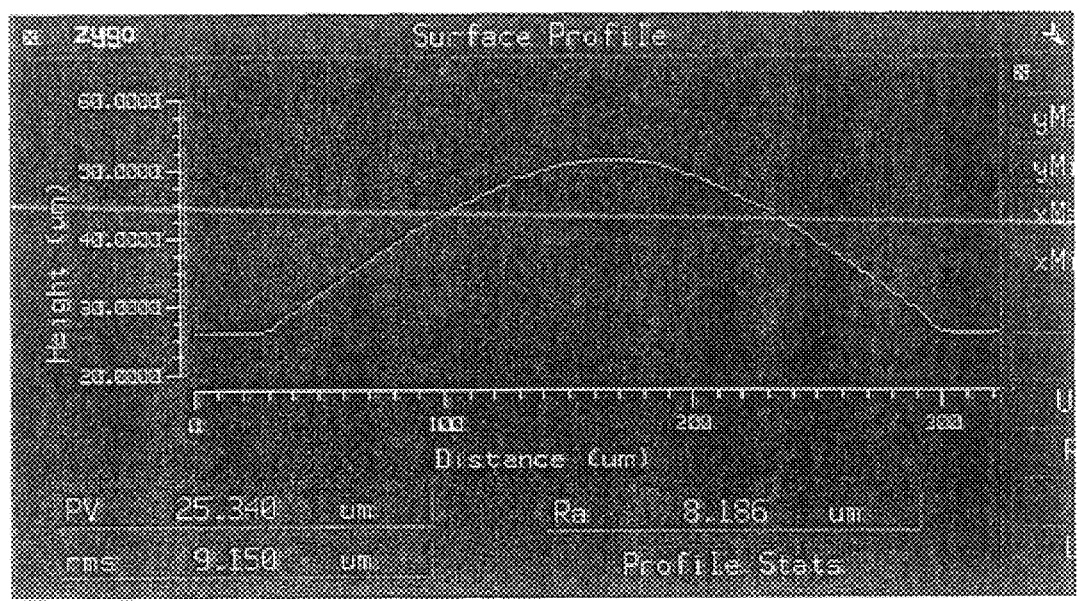

FIG. 14 illustrates optical profilometry data for a toroidal microlens that is f/1.5 in one direction and f/3 in the orthogonal direction. This microlens was patterned with RPC's x-y LPG using Shipley 1075 photoresist. In FIG. 14A the to-down contour map of the microlens is illustrated. Note that for a toroidal microlens, the surface contour is oblong, illustrating the difference in optical power for the two orthogonal surfaces coordinated. In FIG. 14B, a 3-D view of the surface is illustrated. In FIG. 14B, a line trace of the diagonal of the surface is depicted, illustrating a total surface sag of 25.2 $\mu$m.

Figure 15A:
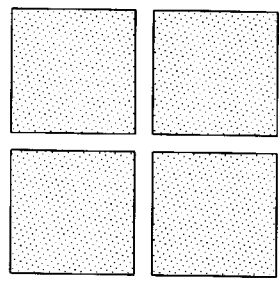
FIG. 15 illustrates microstructures with alignment marks that may be provided simultaneously in conjunction with the microstructures made with the inventive process hereof.
Figure 15B:
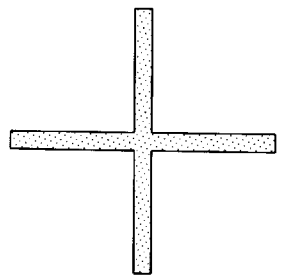
Figure 15C:
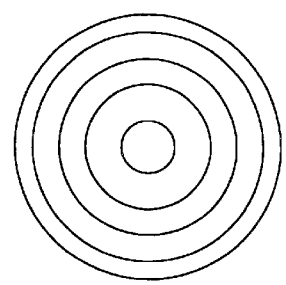

FIG. 15 illustrates possible alignment and registration marks that the method of the current invention allows one to simultaneously write in conjunction with the desired optical structures. These alignment marks are helpful for the wafer processing illustrated in FIGS. 3B and 3C, as well as in the alignment of the individual optical elements to the sources, fibers, or detectors they need to be integrated with. In FIGS. 15A and 15B, we illustrate an inverse cross and a cross that can be used to align two substrates with respect to each other using an optical microscope. In FIG. 15C, we illustrate a diffractive microlens that can be used as part of a micro-interferometer in order to align optical elements using optical alignment schemes.

The foregoing are only illustrative examples. The invention extends to the exposure of a photosensitive material to varying doses of electromagnetic radiation, for the purposes of creating a multi-level or continuous-relief profile that exceeds 15 $\mu$m. The exposure process can be conducted using laser pattern generation, grayscale lithography, etc.

From the foregoing description, it will be apparent that there has been provided an improved system for the fabrication of optical microstructures of arbitrary relief patterns. Variations and modifications in the systems described herein in accordance with this invention will undoubtedly suggest themselves to those skilled in the art. Accordingly, the foregoing description should be taken as illustrative, and not in a limiting sense.

What is claimed is:

1. A method for fabricating a structure on a substrate using a photosensitive material in liquid form which hardens by drying, the substrate having a bottom surface, the method comprising the steps of:
creating a generally uniform layer of the photosensitive material on the substrate by spinning the substrate, the layer being generally uniform and having a height greater than 15 microns;
at least partially but not fully drying the layer at ambient temperature;
fully drying and hardening the layer by applying heat to the bottom surface of the substrate;
producing a surface relief pattern in the layer with a scanning beam of electromagnetic radiation wherein a width of said beam is substantially smaller than a width of said pattern, and
developing exposed portions of the surface relief pattern to produce the structure.

2. The method of fabricating a structure on a substrate as defined in claim 1, further comprising the step of maintaining said substrate in a level position during said drying steps.

3. The method of fabricating a structure on a substrate as defined in claim 1, wherein during said spinning step, said substrate is spun at a plurality of different speeds to promote the creation of a uniformly thick layer of photosensitive material.

4. The method of fabricating a structure on a substrate as defined in claim 3, wherein said substrate is initially spun at a slower speed for coating the substrate with said photosensitive material and then spun at a relatively higher speed to achieve a desired thickness.

5. The method of fabricating a structure on a substrate as defined in claim 1, wherein said layer of photosensitive material is partially dried at ambient temperature long enough for said layer to settle into a more uniform thickness.

6. The method of fabricating a structure on a substrate as defined in claim 5, wherein said partial drying step lasts about 30 minutes.

7. The method of fabricating a structure on a substrate as defined in claim 1, wherein the amount of heat applied to the bottom surface of the substrate is increased over time.

8. The method of fabricating a structure on a substrate as defined in claim 7, wherein the heat applied to the bottom of the substrate is initially ramped up from ambient temperature to about 90° C. and then maintained at 90° C.

9. The method of fabricating a structure on a substrate as defined in claim 1, wherein said photosensitive material has a developer that allows for low-contrast processing.

10. The method of fabricating a structure on a substrate as defined in claim 1, wherein said scanning beam is formed from light having a wavelength that said photosensitive material is substantially transparent to.

11. A method for fabricating a structure on a substrate using a photosensitive material in liquid form which hardens by drying, the substrate having a bottom surface, comprising the steps of:
creating a layer of the photosensitive material on the substrate by spinning the substrate, the layer being generally uniform in thickness and having a height greater than 15 microns;
at least partially but not fully drying the layer at ambient temperature for a sufficient amount of time for said layer to achieve a more uniform thickness;
fully drying and hardening the layer by applying heat to the bottom surface of the substrate;
producing a surface relief pattern in the layer with a scanning beam of electromagnetic radiation, wherein a width of said beam is smaller than a width of said pattern, and
developing portions of the surface relief pattern to produce the structure.

12. The method of fabricating a structure on a substrate as defined in claim 11, further comprising the step of maintaining said substrate in a level position during said drying steps.

13. The method of fabricating a structure on a substrate as defined in claim 11, wherein during said spinning step, said substrate is spun at a plurality of different speeds to promote the creation of a uniformly thick layer of photosensitive material.

14. The method of fabricating a structure on a substrate as defined in claim 13, wherein said substrate is initially spun at a slower speed for coating the substrate with said photosensitive material and then spun at a relatively higher speed to achieve a desired thickness.

15. The method of fabricating a structure on a substrate as defined in claim 14, wherein said substrate is spun at about 200 rpm initially, and then at between about 400 and 1000 rpm until completion of the spinning step.

16. The method of fabricating a structure on a substrate as defined in claim 14, wherein said substrate is spun at a speed of less than 5000 rpm.

17. The method of fabricating a structure on a substrate as defined in claim 11, wherein the amount of heat applied to the bottom surface of the substrate is increased over time.

18. The method of fabricating a structure on a substrate as defined in claim 17, wherein the heat applied to the bottom of the substrate is initially ramped up from ambient temperature to about 90° C. and then maintained at 90° C. for a period of about 10 minutes.

19. The method of fabricating a structure on a substrate as defined in claim 11, wherein said scanning beam is formed from light having a wavelength that said photosensitive material is substantially transparent to.

20. The method of fabricating a structure on a substrate as defined in claim 19, wherein said photosensitive material is photoresist, and said scanning beam has a wavelength of about 442 nm.

21. The method of fabricating a structure on a substrate as defined in claim 11, wherein said substrate is surrounded by a vapor saturated atmosphere during said spinning step to prevent partial drying of said photosensitive material during spinning.

* * * * *